(12) United States Patent
Kasamatsu (10) Patent No.: US 7,769,070 B2
(45) Date of Patent: Aug. 3, 2010

(54) SOLID STATE LASER OSCILLATOR

(75) Inventor: Tadashi Kasamatsu, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 147 days.

(21) Appl. No.: 11/828,777

(22) Filed: Jul. 26, 2007

(65) Prior Publication Data

US 2008/0069156 A1  Mar. 20, 2008

(30) Foreign Application Priority Data

Jul. 26, 2006  (JP)  .............................. 2006-203383

(51) Int. Cl.
*H01S 3/094* (2006.01)
(52) U.S. Cl. ........................................ 372/75
(58) Field of Classification Search .................... 372/75
See application file for complete search history.

(56) References Cited

U.S. PATENT DOCUMENTS

| | | | |
|---|---|---|---|
| 5,048,047 A * | 9/1991 | Kozlovsky et al. ............ | 372/92 |
| 2001/0021210 A1 * | 9/2001 | Nakaya et al. ................ | 372/43 |
| 2002/0172251 A1 * | 11/2002 | Ohtsuka et al. ............... | 372/75 |

OTHER PUBLICATIONS

Takunori Taira, et al., "Diode-Pumped Tunable Yb:YAG Miniature Lasers at Room Temperature: Modeling and Experiment", Journal Selected Topics in Quantum Electronics, vol. 3, No. 1, pp. 100-104, 1997.
Christian Stewen, et al., "A 1-kW CW Thin Disc Laser", Journal Selected Topics in Quantum Electronics, vol. 6, No. 4, pp. 650-657, 2000.
G.J. Dixon, et al., "Pump-resonant excitation on the 946-nm Nd:YAG laser", Optics Letters, vol. 16, No. 6, pp. 396-398, 1991.
William J. Kozlocsky, et al., "Efficient Diode-Laser-Pumped 946 nm Nd:YAG Laser with Resonator-Enhanced Pump Absorption", Journal Selected Topics in Quantum Electronics, vol. 28, No. 4, pp. 1139-1141, 1992.
T. Skettrup, "Fabry-Perot effects with partially coherent light: a method of enhancing slab laser efficiency", Journal of Optics A: Pure and Applied Optics, vol. 2, pp. 546-549, 2000.

* cited by examiner

*Primary Examiner*—Minsun Harvey
*Assistant Examiner*—Patrick Stafford
(74) *Attorney, Agent, or Firm*—Sughrue Mion, PLLC

(57) ABSTRACT

Two end facets of a solid state laser medium function as resonating mirrors that cause a pumping light beam to resonate within the solid state laser medium, which becomes a resonator. A pumping means outputs the pumping light beam, having at least two longitudinal modes and a coherence length greater than or equal to the resonator length of the resonator, to be input to the solid state laser medium such that the laser beam resonates within the resonator.

14 Claims, 8 Drawing Sheets

SOLID STATE LASER OSCILLATOR

BACKGROUND OF THE INVENTION

1. Field of the Invention

The present invention relates to a solid state laser oscillator, and particularly to a solid state laser oscillator capable of highly efficient operation.

2. Description of the Related Art

Solid state laser devices that employ semiconductor laser diodes (LD's) as pumping light sources and utilize solid state laser media, in which rare earth ions (or transition metal ions) are doped in a host, are being actively developed. Many of these solid state laser devices employ solid state laser crystals (solid state laser media) in which neodymium (Nd) is doped as active ions in host crystals of yttrium aluminum garnet ($Y_3Al_5O_{12}$), yttrium vanadate ($YVO_4$) and the like, or glass. In these cases, the absorption coefficient $\alpha$ with respect to pumping light is comparatively high (5-30 $cm^{-1}$), and almost all of the optical power of the pumping light from the LD's can be absorbed with a crystal length d (medium length) of several millimeters. Here, the absorptance within a single pass in a laser medium is expressed by the following formula (1).

$$\eta_{abs}=1-\exp(-\alpha d) \quad (1)$$

For example, Nd:$YVO_4$ (doping concentration: 1 at %) can obtain a pumping light absorption coefficient $\alpha=cm^{-1}$ (pumping wavelength: 808.9 nm), and a single pass absorptance $\eta_{abs}$ can reach 95% with a crystal length of 1 mm. That is, pumping power can be efficiently absorbed with a crystal length of 1 mm. Nd:YAG (doping concentration: 1 at %) can obtain a pumping light absorption coefficient $\alpha=5$ $cm^{-1}$ (pumping wavelength: 808 nm), and a single pass absorptance $\eta_{abs}$ of 63% can be obtained with a crystal length of approximately 2 mm. Generally, increasing the absorptance of pumping light is necessary to improve the total efficiency (efficiency from electricity input to light output) of solid state laser devices. In addition, because pumping light can be absorbed with a short crystal length, miniature LD pumped solid state laser devices are capable of being realized.

In contrast, for solid state laser media having low absorption coefficients, there are cases in which the single pass absorptance is conspicuously low, on the order of 1% to 20%, if the crystal length is only several millimeters. For example, in the case that hot band pumping (pumping wavelength: 885 nm) is to be performed on Nd:YAG, the absorption coefficient $\alpha=1.6$ $cm^{-1}$, and only about 15% of the pumping light is absorbed with a crystal length of 1 mm. Further, Ti:Sapphire crystals (sapphire solid state laser medium doped with titanium ions) exhibit an absorption coefficient $\alpha=1.6$ $cm^{-1}$ (pumping wavelength: 532 nm), and the absorptance is extremely low, at $\eta_{abs}=11\%$ with a crystal length of 2 mm, and $\eta_{abs}=16\%$ even with a crystal length of 3 mm. Note that it is possible to achieve a single pass absorptance $\eta_{abs}>90\%$ even with media having low absorption coefficients $\alpha$, by increasing the crystal length d such that the product $\alpha d$ of the absorption coefficient and the crystal length is greater than or equal to 2.3. However, this results in a drawback that the crystal becomes large, therefore increasing the cost of the device.

Even in cases that the absorption coefficient is comparatively high, in the case that quasi three level laser oscillation is to be performed, it is preferable to avoid increases in the crystal length d. This is because reabsorption of the emitted laser light occurs, which leads to a higher oscillating threshold. For example, Nd:YAG oscillation at 946 nm ($^4F_{3/2}$ to $^4I_{9/2}$), and Yb:YAG ($^2F_{5/2}$ to $^2F_{7/2}$) are quasi three level systems, and it is difficult to realize high absorption of pumping light and a low oscillating threshold simultaneously. There are laser crystals other than Nd:YAG that exhibit quasi three level laser oscillation. Emission of visible light, such as blue oscillation (480 nm, $^3P_0$ to $^3H_4$) of Pr:YLF ($LiYF_4$), blue oscillation (488 nm, $^3P_0$ to $^3H_4$) of Pr:YAG, blue oscillation (482 nm, $^1G_4$ to $^3H_6$) of Tm:YLF, and green oscillation (551 nm, $^4S_{3/2}$ to $^4I_{15/2}$) of Er:YLF all correspond to quasi three level laser oscillation.

Various techniques for improving the absorptance of pumping light have been proposed. The simplest and most often used technique is that in which a mirror for reflecting pumping light is provided at an end facet of or outside a crystal, thereby causing a double pass therethrough (refer to "Diode-pumped tunable Yb:YAG miniature lasers at room temperature: modeling and experiment", T. Taira et al., IEEE J. Selected Topics on Quantum Electronics, Vol. 3, Issue 1, pp. 100-104, 1997). In this case, the absorption length becomes twice the crystal length, and the absorptance increases. However, in the case that the absorption coefficient is extremely low, a mere doubling of the absorption length has limited effects. For example, in the aforementioned hot band pumping of Nd:YAG, if the medium length L is increased from 1 mm to 2 mm, $\eta_{abs}=27\%$, which is still extremely low, even though it has been approximately doubled. Causing multiple passes greater than 2 is difficult with a simple optical system.

Meanwhile, a technique has been realized, in which image relay is employed while shifting the axis of pumping light, to cause multiple passes to occur. In actuality, an optical system that causes pumping light to pass through a thin discoid Yb:YAG crystal (thickness of 0.2-0.5 mm) sixteen times has been proposed ("A 1-kW CW thin disc laser", C. Stewen et al., IEEE J. Selected Topics on Quantum Electronics, Vol. 6, Issue 4, pp. 650-657, 2000). In this case, however, a complex optical system must be provided with precise positioning.

The examples described above are cases in which pumping light is treated as incoherent light. On the other hand, there are cases in which the coherency of pumping laser beams is utilized. An example of such a configuration employs a narrow line width semiconductor laser that oscillates at a single frequency (single longitudinal mode), and utilizes resonator effects provided by an external resonator. In this case, the oscillating frequency of the pumping laser is tuned with the longitudinal mode of the external resonator by temperature or current control, to maintain the resonating state of the pumping laser within the external resonator. A laser crystal is provided within the external resonator, and the pumping light resonates a great number of times within the external resonator. Thereby, even if the single pass absorptance of the laser crystal is low, the same effects as a tenfold to a hundredfold increase in the absorption length can be obtained, and pumping light can be efficiently absorbed ("Pump-resonant excitation of the 946-nm Nd:YAG laser", J. P. Cuthbertson et al., Optics Letters, Vol. 16, Issue 6, pp. 396-398, 1991; "Efficient diode-laser-pumped 946 nm Nd:YAG laser withresonator-enhanced pump absorption", W. J. Kozlovsky et al., IEEE J. Quantum Electronics, Vol. 28, Issue 4, pp. 1139-1141, 1992; and U.S. Pat. No. 5,048,047).

Figure 14:
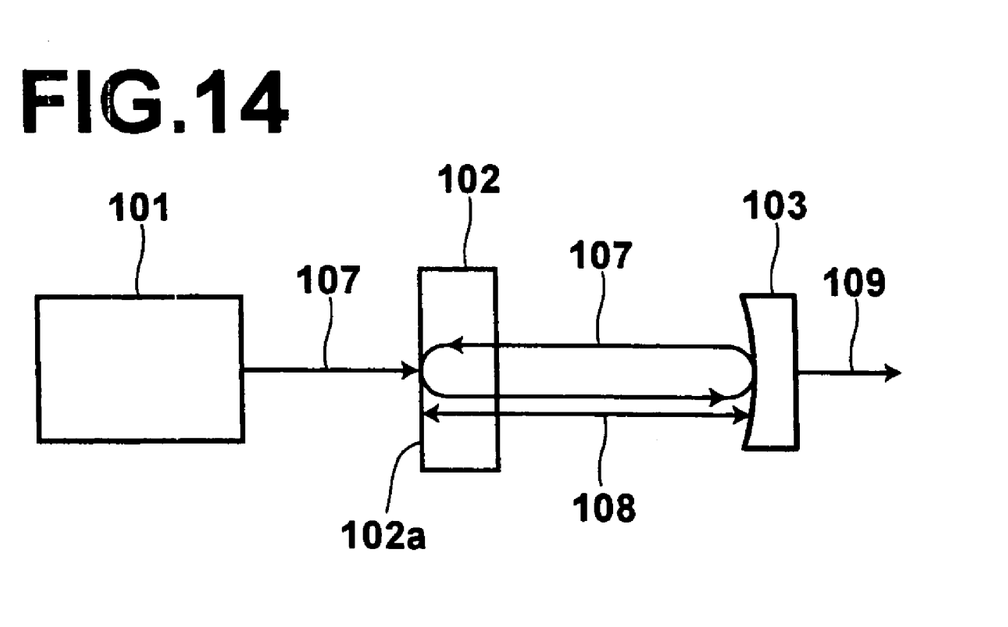
FIG. 14 is a diagram that illustrates a first example of a conventional laser device.

The example disclosed by Cuthbertson et al. employs a single frequency oscillating semiconductor laser (wavelength: 810 nm) as a pumping light source 101, and pumps an Nd:YAG crystal 102, as illustrated in FIG. 14. The rear side 102a (toward the semiconductor laser) of the Nd:YAG crystal 102 and an output mirror 103 function as a resonator for an emitted laser light beam 108 as well as for a pumping light beam 107. The rear side 102a of the Nd:YAG crystal is formed to be highly reflective with respect to the emitted laser light beam 108, and partially reflective (reflectance: 85%) with respect to the 810 nm pumping light beam 107. The output mirror 103 is formed to be partially reflective (reflectance: 99.5%) with respect to the emitted laser light beam 108, and highly reflective with respect to the pumping light beam 107. The resonator length is 10 mm. The thickness of the Nd:YAG crystal is 0.3 mm, and the Nd doping concentration is 1 at %. An output light beam 109 (wavelength: 946 nm) having an output power of 1 mW is obtained with a pumping power of 10 mW. Although there is no disclosure regarding single pass absorption, it can be estimated to be 15%. In this example, oscillation at 946 nm is of the quasi three level type. If the single pass absorption is higher, loss due to reabsorption at a lower laser level increases, which results in decreased oscillation efficiency. Therefore, the extremely thin laser crystal is employed in this configuration.

Figure 15:
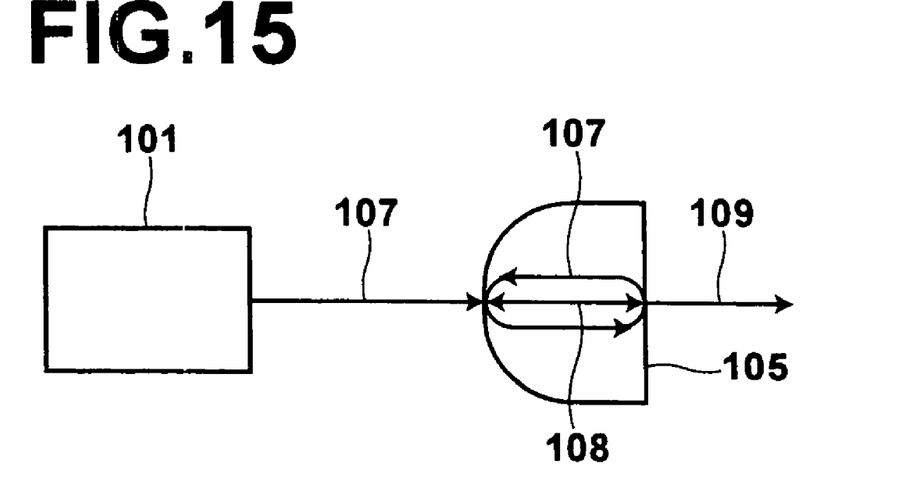
FIG. 15 is a diagram that illustrates a second example of a conventional laser device.

Kozlovsky et al. and U.S. Pat. No. 5,048,047 also disclose laser devices that realize oscillation at 946 nm employing Nd:YAG crystals. These laser devices comprise a laser crystal 105 with a thickness of 0.33 mm, as illustrated in FIG. 15. The end facets of the laser crystal 105 are formed as resonator mirrors that construct a resonator for both a pumping light beam 107 and an emitted laser light beam 108. Although not shown in the figure, stable operation is realized by providing a wavelength tuning circuit. In this example, an output light beam 109 having a wavelength of 946 nm and an output power of 30 mW is obtained with a pumping power of 600 mW. Single pass absorption is 18%.

In the conventional laser devices illustrated in FIG. 14 and FIG. 15, single frequency (single longitudinal mode) continuous wave laser diodes are utilized as pumping light sources. However, it is difficult to increase the output of continuous wave pumping lasers. In order to emit single frequency laser beams, it is necessary to provide etalons, diffraction gratings, or distribution feedback (DFB) structures within resonators, to cause oscillation at only a desired laser oscillation frequency. This causes loss with respect to other frequencies, and often results in decreased pumping laser beam output. This necessarily results in decreased output of a solid state laser device that uses the pumping laser. Generally, the output of single frequency oscillating semiconductor lasers is limited to be within a range of approximately 10 mW to 100 mW.

As described above, there are two conventional techniques which have been proposed in order to increase the effective absorptance of solid state laser media having low single pass absorptance: (1) using a multiple pass pumping optical system; and (2) using a narrow line width single frequency pumping laser and an external resonator to increase absorption.

However, technique (1) has a problem that the pumping optical system becomes extremely complex or large, and technique (2) has a problem that the narrow bandwidth of the pumping light beam reduces the pumping power, which precludes high power laser output. To date, a miniature and high output solid state laser device has not been realized.

SUMMARY OF THE INVENTION

The present invention has been developed in view of the foregoing circumstances. It is an object of the present invention to provide a miniature and high output solid state laser oscillator that can realize high effective absorptance in solid state laser media having low single pass absorptance.

Taking a Lorentz spectral distribution into consideration, the coherence length Lc of a laser beam is expressed as a function of a spectral line width $\Delta v$ by the following formula (2)

$$L_c = \frac{c}{\pi \Delta v} \tag{2}$$

wherein: c is the speed of light; and $\Delta v$ is the spectral line width (frequency width) of a light source. (Refer to Formula (2) in "Fabry-Perot effects with partially coherent light: a method of enhancing slab laser efficiency", T. Skettrup, Journal of Optics A: Pure and Applied Optics, Vol. 2, pp. 546-549, 2000, or A. Yariv, Basics of Optical Electronics $3^{rd}$ Edition, Chapter 10, Maruzen Publishing.)

Generally, the spectral line width of single frequency continuous wave laser diodes is within the range of 100 kHz to 10 MHz. In this case, coherence lengths are within the range of Lc=9.5 m (10 MHz) to 950 m (100 kHz), and may be extremely long. For this reason, in the aforementioned laser devices (in which the resonator lengths of the external resonator <1 cm), the pumping light beam resonates within the external resonator effectively as a completely coherent light beam. Accordingly, the aforementioned gain effect of the pumping light can be expected.

Meanwhile, the present inventor has discovered that it is not necessary for a pumping laser to be a narrow line width single frequency laser beam. This is because the spectral line width of a pumping light beam necessary to realize high absorptance thereof is a function of the resonator length of an external resonator and a desired effective absorptance. In addition, if a laser which is not a single longitudinal mode laser, such as a Fabry Perot laser diode, is used as the pumping laser, output power within a range of several hundred mW to 1 W can be obtained.

The present invention has been developed based on the aforementioned discovery by the present inventor. A solid state laser oscillator of the present invention comprises:

a solid state laser medium doped with rare earth ions or transition metal ions;

a first resonator in which the solid state laser medium is provided, for causing light output from the solid state laser medium to oscillate as a laser beam; and pumping means, for outputting a pumping light beam that excites the solid state laser medium; wherein:

two end facets of the solid state laser medium function as resonating mirrors to construct a second resonator in which the pumping light beam resonates;

the pumping means outputs a laser beam, having at least two longitudinal modes and a coherence length greater than or equal to the resonator length of the second resonator, to be input to the solid state laser medium such that the laser beam resonates within the second resonator.

The solid state laser oscillator of the present invention having the construction described above is capable of shortening the coherence length of the pumping light beam than conventional laser devices that use narrow line width single frequency pumping light sources. The coherence length of the pumping light beam can be 9.5 m (10 MHz) or less.

The solid state laser oscillator of the present invention is favorably applied when the solid state laser media has a single pass absorptance of 40% or less, 20% or less, and further, 10% or less, with respect to the pumping light beam.

It is desirable for the pumping light intensity reflectance $R_1$ of an input mirror, which is one of the resonating mirrors that constitute the second resonator, for leading the pumping light beam into the second resonator to satisfy the conditions:

$$R_m e^{-2\gamma} e^{-L/Lc} \geq R_1 \geq 2R_m e^{-2\gamma} e^{-L/Lc}$$

wherein: $R_m$ is a product of the pumping light intensity reflectance of mirrors that constitute the second resonator other than the input mirror and the propagation efficiency within the resonator; $\gamma = \alpha d \cos\theta$ is an attenuation coefficient of the pumping light electrical field for one orbit within the solid state laser medium; d is a medium length of the solid state laser medium; $\alpha$ is the absorptance of the solid state laser medium with respect to the pumping light beam; $\theta$ is the incidence angle of the pumping light beam with respect to the solid state laser medium; L is the resonator length of the second resonator; and Lc is the coherence length of the pumping light beam.

Note that in the case that the second resonator is a ring type resonator constituted by a plurality of resonating mirrors, $R_m$ is the product of the pumping light intensity reflectance of all of the mirrors other than the input mirror and a round trip propagation efficiency; and L is the round trip resonator length.

It is desirable for the solid state laser medium to emit visible light. It is desirable for the pumping means to comprise a GaN type semiconductor laser. A GaN semiconductor laser, an InGaN semiconductor laser, and an AlGaN semiconductor laser are examples of GaN type semiconductor lasers.

It is desirable for the two end facets of the solid state laser medium to also constitute the first resonator.

The solid state laser oscillator may further comprise: a nonlinear medium, which is a wavelength converting element for converting the wavelength of light emitted by the solid state laser medium, provided within the first resonator. The nonlinear medium may be a second harmonic generating nonlinear medium for converting the wavelength of the light emitted from the solid state laser medium to a second harmonic thereof. Alternatively, the nonlinear medium may be that which generates a sum frequency or a difference frequency of the pumping light beam and the light emitted by the solid state laser medium.

A second solid state laser oscillator of the present invention comprises:

a solid state laser medium, which is doped with rare earth ions or transition metal ions;

a nonlinear medium, which is a wavelength converting element for converting the wavelength of light emitted by the solid state laser medium; and pumping means, for outputting a pumping light beam that excites the solid state laser medium; wherein:

an end facet of the solid state laser medium and an end facet of the nonlinear medium are bonded;

a resonator, in which the emitted light and the pumping light beam resonates, is constituted by the other end facet of the solid state laser medium and the other end facet of the nonlinear medium;

the pumping means outputs a laser beam, having at least two longitudinal modes and a coherence length greater than or equal to the resonator length of the resonator, to be input to the solid state laser medium such that the laser beam resonates within the resonator.

The second solid state laser oscillator of the present invention having the construction described above is capable of shortening the coherence length of the pumping light beam than conventional laser devices that use narrow line width single frequency pumping light sources. The coherence length of the pumping light beam can be 9.5 m (10 MHz) or less.

It is desirable for the first and second solid state laser oscillators of the present invention to have a configuration, wherein: the pumping means and the solid state laser medium are mounted within the same package. In this case, it is desirable for the pumping means and the solid state laser medium to be held by a single support, or held by a support which is integrated by bonding.

Further, it is desirable for the first and second solid state laser oscillators of the present invention to further comprise: temperature adjusting means, for adjusting the temperatures of the pumping means and the solid state laser medium.

In the solid state laser oscillator of the present invention, the end facets of the solid state laser medium function as resonating mirrors to construct a second resonator in which the pumping light beam resonates. The pumping means outputs a laser beam, having at least two longitudinal modes and a coherence length greater than or equal to the resonator length of the second resonator, to be input to the solid state laser medium such that the laser beam resonates within the second resonator. The pumping light beam reciprocally passes through the solid state laser medium a plurality of times. Therefore, effective absorptance can be increased even in solid state laser media having low single pass absorptance, and highly efficient operation of the solid state laser oscillator is enabled.

The construction of the pumping means can be miniaturized and the pumping light beam can be higher in output, compared to a case in which the conventional single longitudinal mode laser beam is employed as the pumping light. Therefore, the device as a whole can be constructed as a miniature and high output solid state laser oscillator and a solid state laser amplifier. The etalon effect of the solid state laser medium is utilized. Therefore, band narrowing means for narrowing the bandwidth of the laser beam need not be provided in the pumping means, which enables further miniaturization of the device.

The solid state laser oscillator can obtain advantageous effects of high efficiency more conspicuously as the single pass absorptance becomes smaller, such as 40% or less, 20% or less and further, 10% or less.

DESCRIPTION OF THE PREFERRED EMBODIMENTS

Hereinafter, embodiments of the present invention will be described.

Figure 1:
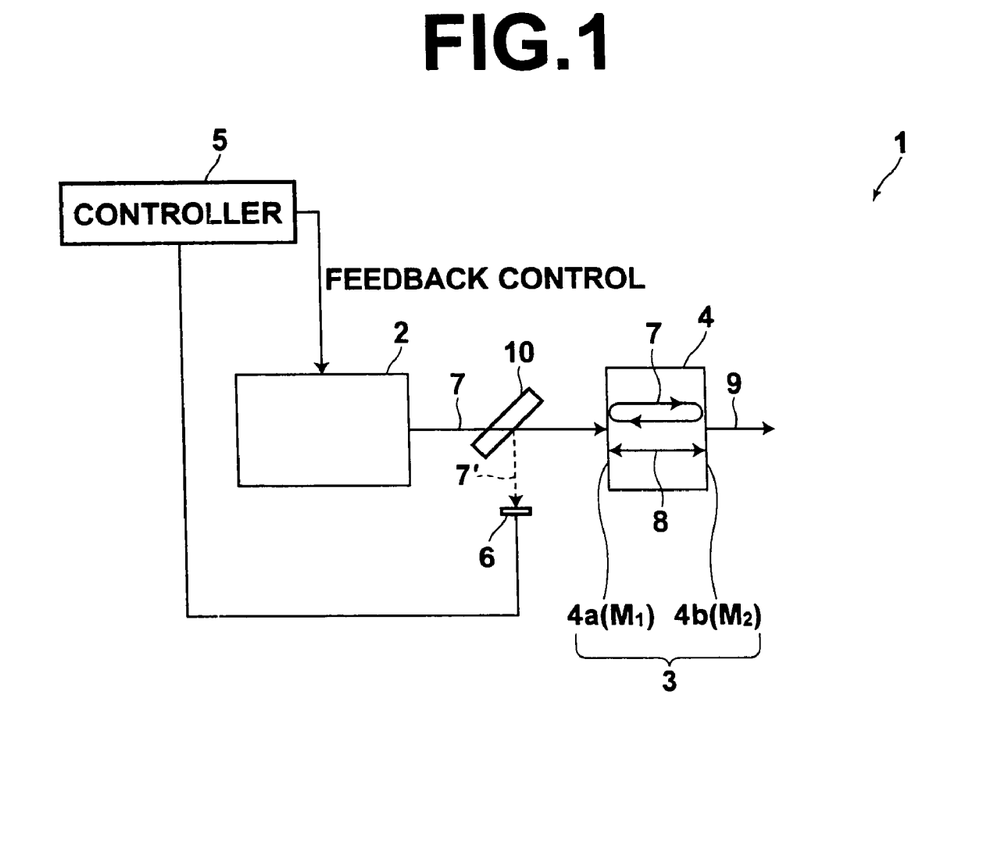
FIG. 1 is a diagram that illustrates the schematic structure of a solid state laser oscillator according to a first embodiment of the present invention.

FIG. 1 is a diagram that illustrates the schematic structure of a solid state laser oscillator 1 according to a first embodiment of the present invention. The solid state laser oscillator 1 comprises: a pumping laser 2, as a pumping means for exciting a solid state laser medium 4 (solid state laser crystal); the solid state laser crystal 4, of which both end facets have coatings administered thereon; and a temperature controller 5 (hereinafter, simply referred to as "controller 5") for detecting the resonating state of a pumping light beam 7 emitted by the pumping laser 2 and providing feedback to the pumping laser 2. Note that the "resonating state" is conceptually a state in which the frequency and the phase of the pumping light beam 7 and the frequency of an external resonator match. However, in actuality, a state in which a reflected light beam 7' becomes minimal will be judged to be the resonating state.

Here, predetermined coatings are administered on a rear side end facet 4a and an output side end facet 4b of the laser crystal 4, respectively. The coatings form a highly reflective mirror or a partially reflective mirror with respect to the pumping light beam 7 and an emitted light beam 8. A resonator 3 that causes both the pumping light beam 7 and the emitted light beam 8 to resonate is constituted by the rear side end facet 4a (hereinafter, referred to as "mirror M1") and the output side end facet 4b (hereinafter, referred to as "mirror M2").

The controller 5 receives and monitors the reflected light beam 7', reflected by the mirror M1 and a half mirror 10, with a light receiving element 6, to adjust the temperature of the pumping laser 2. Here, the controller 5 controls a cooling means such as a Peltier element (not shown) that the pumping laser 2 is equipped with. The controller 5 may be of any configuration as long as it is capable of adjusting the temperature of the pumping laser 2 and/or the laser crystal 4.

Figure 2:
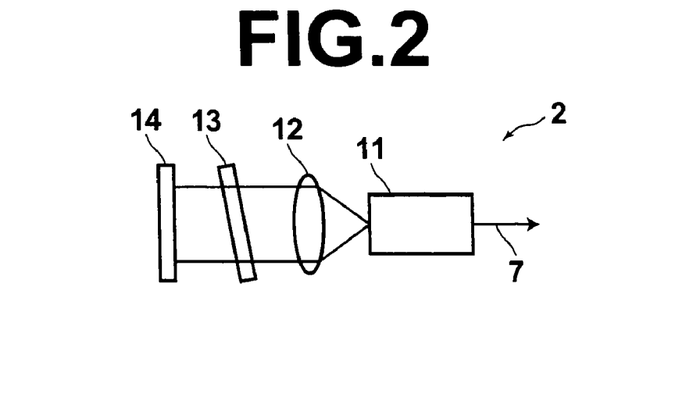
FIG. 2 is a diagram that illustrates the schematic structure of a pumping laser.

The pumping laser 2 outputs a laser beam having at least two longitudinal modes, to be input to the solid state laser crystal 4 such that the laser beam resonates within the resonator 3. As illustrated in FIG. 2, the pumping laser 2 comprises: a semiconductor laser 11; a collimating lens 12, for collimating the pumping light beam 7 emitted from the semiconductor laser 11; a wavelength selecting filter 13, for narrowing the spectral width of the collimated pumping light beam; and a total internal reflection mirror 14. note that in FIG. 2, the pumping light beam 7 which is output (propagates toward the half mirror 10) is schematically represented by an arrow, and an optical system that causes the pumping light beam 7 to enter the solid state laser crystal 4 is omitted. The pumping laser 2 may further comprise bandwidth narrowing means, for narrowing the spectral width of the light beam output from the semiconductor laser 11, such as an external resonator, a diffraction grating, or etalons. However, in the present embodiment, it is not necessary to narrow the spectral width of the laser beam output from the semiconductor laser 11. Note that the wavelength selecting filter 13 is not absolutely necessary.

In the present embodiment, the laser crystal 4 is Nd:YAG (doping concentration: 0.1 at %) that performs quasi three level oscillation at 946 nm. The crystal length d of the laser crystal 4 is d=0.5 mm, and the absorption coefficient α with respect to the pumping light beam is α=0.5 cm$^{-1}$. The absorptance $\eta_{abs}$ with respect to the pumping light beam 7 within a single pass is $\eta_{abs}$=1−exp(αd)=2.5%. Here, the resonator length L is equal to the crystal length L, that is, 0.5 mm, and the wavelength of the pumping light beam 7 is 810 nm.

Figure 3:
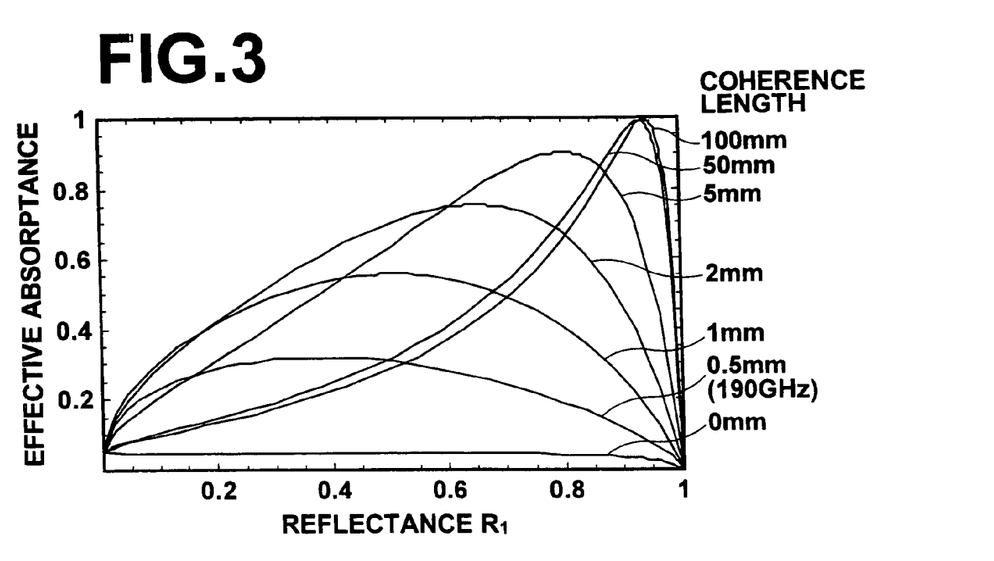
FIG. 3 is a graph that illustrates the dependency of effective absorptance on input mirror reflectance in the first embodiment (when single pass absorptance is 2.5%)

FIG. 3 illustrates calculation results of the dependency of the pumping light intensity reflectance $R_1$ of the input mirror M1, which is the effective absorptance in the solid state laser crystal 4, when the coherence length Lc of the pumping light beam is changed from 0 mm (an incoherent state) to 100 mm (the curves in FIG. 3 represent cases in which the coherence length Lc is 100 mm, 50 mm, 5 mm, 2 mm, 1 mm, 0.5 mm, and 0 mm from top to bottom). However, loss due to scattering within the resonator 3 was ignored, as it was judged to be sufficiently less than absorption within a single pass. The pumping light intensity reflectance $R_2$ of the output mirror M2 was set to $R_2$=1. The calculation method used the Fabry Perot theory of coherence ("Fabry-Perot effects with partially coherent light: a method of enhancing slab laser efficiency", T. Skettrup, Journal of Optics A: Pure and Applied Optics, Vol. 2, pp. 546-549, 2000) as a reference. The optical electrical field of the coherent components reflected by this resonator is expressed as the following formula (3), taking the coherence length into consideration. However, the spatial mode is assumed to be that of planar waves. The first term represents reflection at the mirror M1, the second term represents a component of the pumping light beam that passes through the mirror M1 after a first reciprocal reflection (including absorption, an attenuation effect of coherent components due to coherence length, and a phase difference due to the reciprocal reflection), and so on, such that components which are reciprocally reflected a great number of times are added.

$$E_{coh}^r = E_{in} \begin{pmatrix} r_1 + t_1 r_m t_1 e^{i\phi} e^{-\gamma} e^{-L/2L_c} + \ldots + \\ t_1 r_m t_1 e^{i\phi} e^{-\gamma} e^{-L/2L_c} [r_1 r_m e^{i\phi} e^{-\gamma} e^{-L/2L_c}]^{n-1} + \ldots \end{pmatrix} \quad (3)$$

wherein: $E_{in}$ is an incident electrical field; $r_1$ is the pumping light electrical field reflectance of the input mirror M1; $t_1$ is the pumping light electrical field transmittance of the input mirror M1; $r_m = r_2 r_3 (1-E_L)$ is the product of the electric field reflectance and propagation efficiency for reciprocal reflection within the resonator for all mirrors other than the input mirror; $r_2$ is the pumping light electric field reflectance of the mirror M2; $r_3$ is the pumping light electric field reflectance of a mirror M3; $E_L$ is loss due to electric filed scattering during reciprocal reflection within the resonator; $\Phi=2\cdot2\pi/\lambda L$ is a phase difference for each reciprocal reflection; $\gamma=\alpha d\cos\theta$ is an attenuating coefficient of the pumping light electric field for each reciprocal reflection within the laser crystal; L is the resonator length; d is the crystal length (thickness of the crystal); and $\theta$ is the incidence angle with respect to the crystal. Similarly, the transmitted coherent electric field and the electric field of incoherent components, and ultimately, an absorption power can be calculated. In the calculations, the phase difference $\Phi=2p\pi$ (wherein p is an integer).

In this case, the effective absorptance increases to approximately 12 to 20 times the single pass absorptance, as long as the coherence length is greater than or approximately equal to the resonator length (0.5 mm), and preferably approximately twice the resonator length. It can be seen from FIG. 3 that when the coherence length is 1 mm and the pumping light intensity reflectance $R_1$ of the input mirror M1 is $R_1=0.5$, an effective absorptance of 56% can be obtained. Further, it can be understood that when the coherence length (5 mm) is approximately 10 times the resonator length, an absorptance of 90% or greater can be obtained in the vicinity of $R_1=0.8$. Of course, in cases that the coherence length is sufficiently greater than the resonator length (100 times or greater=50 mm or greater), almost all of the pumping power can be absorbed, by appropriately selecting a pumping light intensity reflectance $R_1$ (note that here, loss due to scattering is ignored).

The value for the pumping light intensity reflectance $R_1$ of the mirror M1 at which the absorptance become maximal can be obtained by the following formula (4), in cases that the coherence length is sufficiently longer than the resonator length. Note that here, $R_m$ is the pumping light intensity reflectance $R_2$ of the mirror M2, if loss due to scattering within the resonator is ignored.

$$R_1=R_m e^{-2\gamma}e^{-L/L_c} \quad (4)$$

However, increases due to the coherent effect are not found only at a value obtained by the above formula, but desirable values can be found in the vicinity thereof. Specifically, sufficient coherent effects can be obtained within the range defined by the following inequality (5)

$$R_m e^{-2\gamma}e^{-L/L_c} \geq R_1 \geq 2\times R_m e^{-2\gamma}e^{-L/L_c} \quad (5)$$

A coherence length of 0.5 mm corresponds to a spectral width $\Delta\nu$ of 190 GHz of a laser beam which is the pumping light beam 7 output by the pumping laser. If expressed as a wavelength, the coherence length is 0.4 nm (at a wavelength of 800 nm). This indicates that it is completely unnecessary to utilize a narrow line width DFB laser or a semiconductor laser having an external resonator at wavelength intervals of this order. This line width is an easily achieved value, and reduction in pumping power due to loss accompanying narrowing of bandwidth can be suppressed, thereby enabling high output. In the case that the pumping laser is equipped with an external resonator, and a diffraction grating or a wavelength selecting filter is inserted, the resonator length becomes approximately 5 cm. At this time, a free spectral range becomes 3 GHz, and approximately 60 longitudinal modes oscillate, instead of a single frequency.

In an experiment using the Fabry Perot type semiconductor laser 11 (spectral width of 1 nm during free running oscillation), of which the bandwidth was narrowed using only the wavelength selecting filter 12 (transmitted bandwidth of 0.5 nm), oscillation with a spectral width of approximately 0.04 nm was easily realized. An output of 500 mW and a line width of 20 GHz (wavelength: 800 nm, coherence length: 4.7 mm) were obtained. In the solid state laser oscillator 1 that employs this laser as the pumping laser 2 as illustrated in FIG. 1, the absorbed power was 450 mW (absorptance: 90%), the threshold value was 100 mW, and an output light beam 9 having a wavelength of 946 nm and an output power of 160 mW (slope efficiency: 45%) was obtained. In the case that no resonator that causes the pumping light beam to resonate is provided, the absorptance of the laser crystal with respect to the pumping light beam is 2.5% for a single pass. In this case, only 12.5 mW of the pumping power is absorbed. Accordingly, the threshold value necessary for oscillation is not exceeded, and laser oscillation cannot be obtained. In the case that no resonator is provided, the absorption length necessary to obtain an absorptance of 90% is 4.6 cm, that is, 92 passes (46 reciprocal passes) through the 0.5 mm crystal. However, it is extremely difficult to realize 92 passes without employing a resonator. Note that the resonator structure at this time was: a flat mirror as the mirror M1; a flat mirror as the mirror M2. The spot radius of the pumping light beam on the crystal 4 was 72 μm. A coating having a reflectance of 80% with respect to the pumping light beam 7, and highly reflective (HR) with respect to light having a wavelength of 946 nm was administered to form the mirror M1. A coating highly reflective with respect to the pumping light beam 7, and having a reflectance of 99% with respect to light having a wavelength of 946 nm was administered to form the mirror M2.

Figure 4:
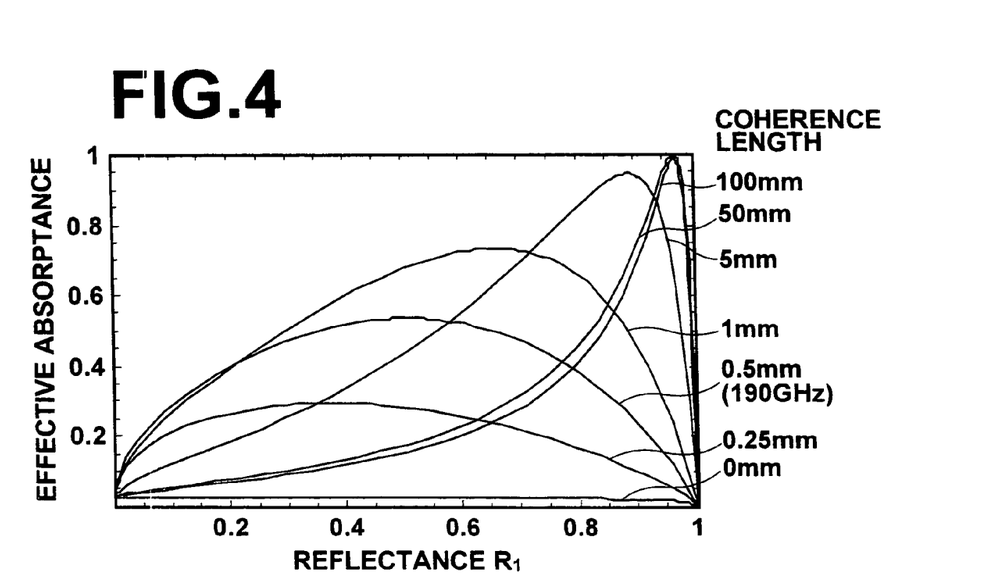
FIG. 4 is a graph that illustrates the dependency of effective absorptance on input mirror reflectance in the first embodiment (when single pass absorptance is 1.2%)

Further, if the crystal thickness is reduced to approximately 0.25 mm, the absorptance decreases to approximately 1.2%, and the dependency of the effective absorptance on the reflectance $R_1$ becomes that illustrated in FIG. 4. Here, the required coherence length is greater than or equal to 0.25 mm, and the spectral width increases conspicuously to 0.8 nm (381 GHz). In this case, a Fabry Perot laser that oscillates in a single transverse mode, and of which the bandwidth has been narrowed slightly, can be utilized. Depending on the case, the Fabry Perot laser may be utilized without narrowing the bandwidth.

In a specific experiment, a Fabry Perot semiconductor laser having an output of approximately 1 W was provided with an external resonator. A volume Bragg diffraction grating with a spectral width of 0.5 nm was inserted. It was confirmed that oscillation at 0.1 nm was easily realized, and that an output power of approximately 800 mW could be obtained. Note that when this laser is employed as a pumping laser to pump a solid state laser crystal with a crystal length (etalon thickness) of 0.25 mm, an effective absorptance of 80% was obtained, and a laser oscillation efficiency of 40% with respect to the absorbed power 640 mW, that is, a 250 mW laser beam having a wavelength of 946 nm, was obtained. In this case, the free spectral range (FSR) of the 946 nm wavelength, which is determined by (the thickness of) the etalon, was 600 GHz (spectral width: 1.8 nm). This is wider than the laser gain width 0.5 nm, and therefore laser oscillation was realized in a single longitudinal mode.

In this manner, when the laser crystal is viewed as an etalon, finesse becomes approximately 25 with an FSR of 600 GHz. The tuning range necessary for resonance to occur is approximately 24 GHz, which is the resonator width of the etalon=FSR/finesse. The present invention is a practically effective means, and sufficient coherent effects can be obtained within widths which are considerably larger than this. Coherent effects can be obtained easily within a tuning range of approximately half the FSR, without stringent temperature adjustment of the semiconductor laser or the etalon. Accordingly, although the controller 5 is illustrated as a component of the embodiment of FIG. 1 (and the following embodiments), it is not a necessary requirement, and may be obviated in certain cases.

Note that in the case that an external resonator for causing a pumping light beam to resonate is provided as in the present invention, it is necessary to tune the oscillating frequency of the pumping laser to the external resonator, or to match the frequency of the external resonator to the pumping laser. An example of such a tuning method is the Pound Drever technique. The Pound Drever technique detects light reflected by an input mirror of an external resonator, and finely controls the resonator length to minimize the amount of reflected light. In order for optimal resonance to occur, it is considered necessary to: 1) match the spatial modes of the pumping light beam and the emitted light beam; and 2) match impedances (the pumping light intensity reflectance $R_1$ of the input mirror M1=loss within the resonator, corresponding to Formula (4)). For a detailed description, refer to Chapter 4 of W. P. Risk et al., Compact Blue-Green Lasers, Cambridge University Press. Regarding the first requirement, the mode of the pumping laser may be matched to the resonator mode of the external resonator. As they are both $TEM_{00}$ modes, this operation is comparatively easy. Specifically, the resonator mode of the external resonator is calculated by a ray matrix or the like, to obtain the mode spot diameter and the waist position thereof. The pumping laser beam is shaped by an external lens system such that it is focused at the waist position with the spot diameter. Regarding the second requirement, it has been made clear by the present inventor's research that sufficient resonance effects are generated, even if impedances are not perfectly matched, as illustrated in FIG. 3.

Figure 5:
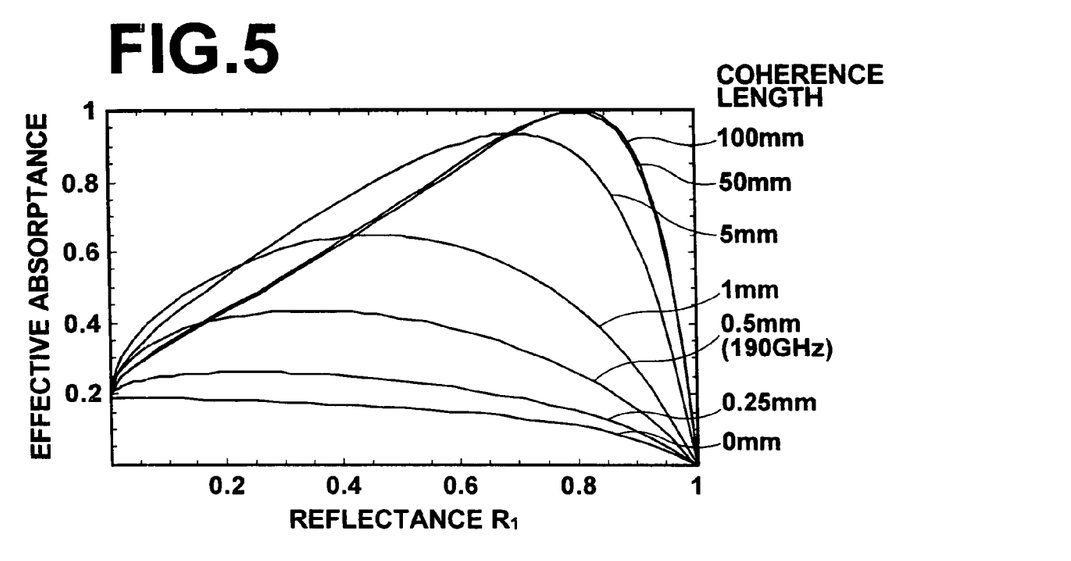
FIG. 5 is a graph that illustrates the dependency of effective absorptance on input mirror reflectance in the first embodiment (when single pass absorptance is 10%)
Figure 6:
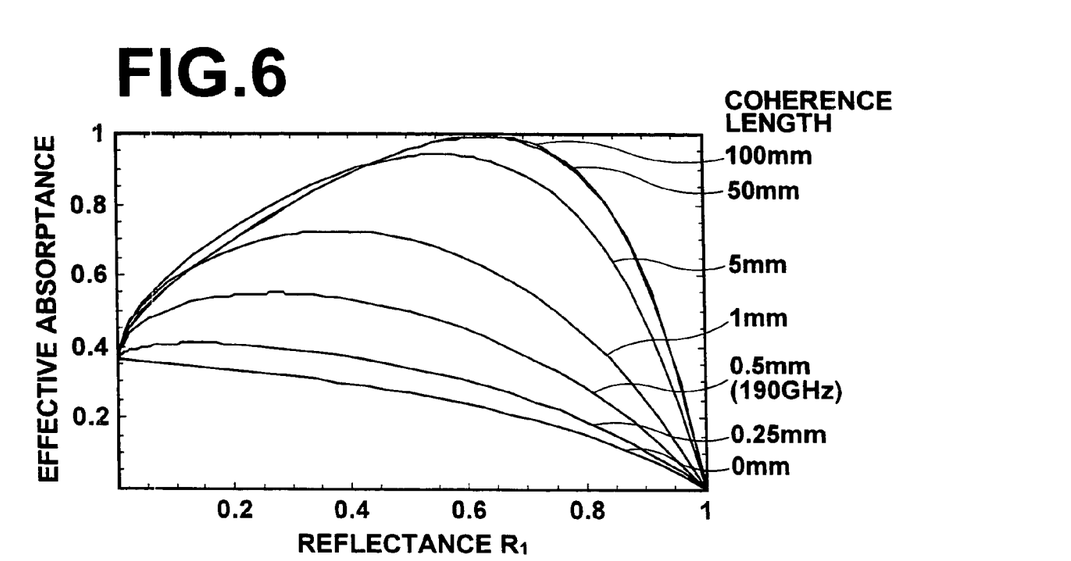
FIG. 6 is a graph that illustrates the dependency of effective absorptance on input mirror reflectance in the first embodiment (when single pass absorptance is 20%)

In the case that single pass absorptance is 10% or greater, the coherent effects of the present invention enable obtainment of increased absorption. FIG. 5 and FIG. 6 illustrate cases in which single pass absorptance is 10% ($\alpha=2.1$ cm$^{-1}$) and 20% ($\alpha=4.5$ cm$^{-1}$), with a crystal length of 0.5 mm. However, it can be seen that the rate of absorption increase due to the coherent effect becomes greater as the single pass absorptance is lower. For example, if FIG. 3 and FIG. 5 are compared, in the case that the coherence length is 0.5 mm, the maximum effective absorptance is 32% and 43%, respectively. When the increase from the single pass absorptance is considered, the increases are 12 times and 4.3 times, respectively. This is because loss within the external resonator increases as the single pass absorptance is greater, and the number of reciprocal reflections of the pumping light beam within the resonator decreases. In other words, this is equivalent to a decrease in the effective finesse of the resonator.

If the single pass absorptance is greater than 40%, absorptance of 65% or greater can be obtained with a conventional double pass structure that does not employ an external resonator. Accordingly, the present invention is extremely effective in cases that the single pass absorptance is less than or equal to 40%, as increases of 2 times to 20 times the single pass absorptance can be realized.

In the embodiment described above, an Nd:YAG crystal was employed. However, the present invention may be applied to any laser crystal. For example, a Pr:YLF (LiYF$_4$) crystal is pumped with a pumping light beam having a wavelength of 440 nm, to oscillate at 639.5 nm ($^3P_0$ to $^3F_2$), 522 nm ($^3P_1$ to $^3H_5$), and 480 nm ($^3P_0$ to $^3H_4$). Particularly in the case of oscillation at 480 nm, the effects of applying the present invention are conspicuous, because a quasi three level energy structure is adopted. A solid state laser oscillator having a configuration similar to that illustrated in FIG. 1 was constructed, and the bandwidth of a laser beam (output: 40 mW) emitted by a 440 nm wavelength GaN semiconductor laser was narrowed to a frequency width of approximately 100 GHz (wavelength interval: 0.06 nm). As a result, an effective absorptance of 70% was obtained using a crystal having a single pass absorptance of approximately 5%. A 1 mW blue oscillation at 480 nm was obtained with an absorbed power of 25 mW. Similarly, oscillation in the visible light range by laser crystals such as Pr:YAG (488 nm, $3p$ to $^3H_4$), Ho:YLF (540 nm, $^5S_2$ to 918), Tm:YLF (482 nm, $^1G_4$ to $^3H_6$), and Er:YLF (551 nm, $^4S_{3/2}$ to $^4I_{15/2}$) commonly oscillate with a quasi three level energy structure. Therefore, great improvements in the properties thereof can be expected by applying the present invention thereto.

Figure 7:
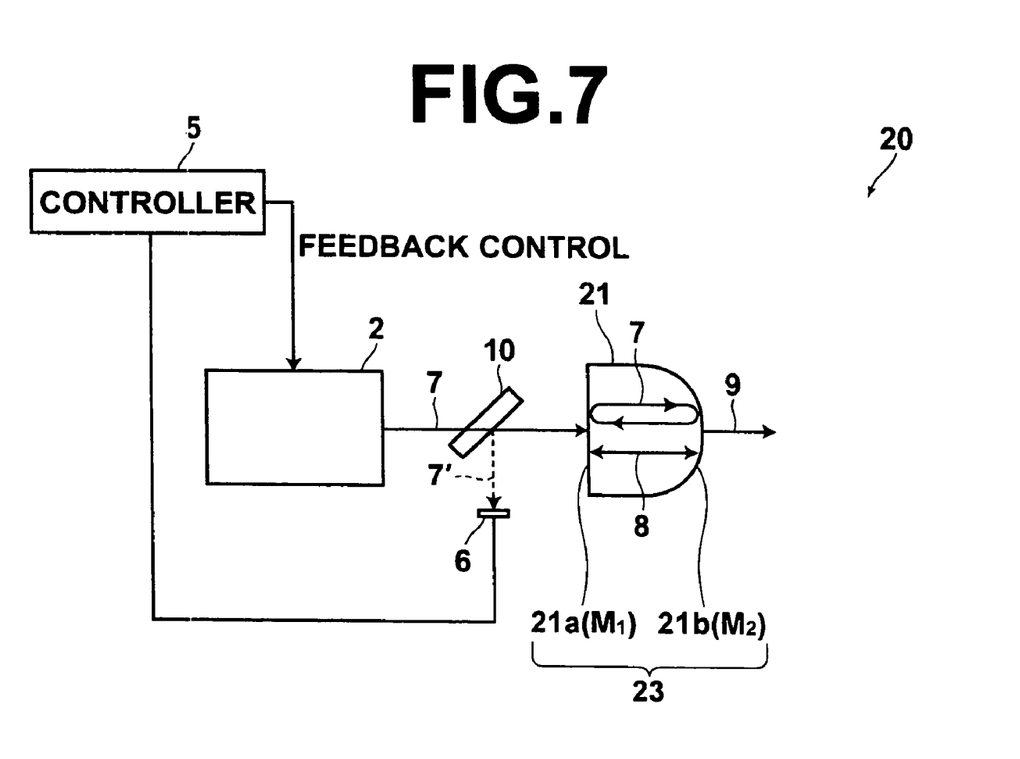
FIG. 7 is a diagram that illustrates the schematic structure of a solid state laser oscillator according to a second embodiment of the present invention.

Note that the solid state laser oscillator 1 of the first embodiment employed the solid state laser crystal 4 having planar cuts. Alternatively, a solid state laser crystal, of which one or both end facets are curved, may be employed. An example of such a solid state laser oscillator is illustrated in FIG. 7 as a solid state laser oscillator 20 according to a second embodiment of the present invention. Note that in the following description, elements which are the same as those of the solid state laser oscillator of FIG. 1 are denoted with the same reference numerals, and detailed descriptions thereof will be omitted.

The solid state laser oscillator 20 according to the second embodiment differs from that of the first embodiment in that it employs a solid state laser crystal 24, of which one end facet 24a is a plane and the other end facet 24b is a curved surface. In this case, for example, if a thermal lens is small, a stable resonator mode can be formed by a large curvature (several tens of centimeters or several meters). If a thermal lens is strong, on the other hand, one or both of the end facets can be formed as concave surfaces to compensate for the thermal lens and enable stable operation of the resonator. Here, the "thermal lens" refers to optical aberrations caused by temperature gradients corresponding to an excitation distribution in a state in which the laser crystal is pumped. The optical aberrations commonly generate lens effects, and are therefore referred to as a "thermal lens".

Figure 8:
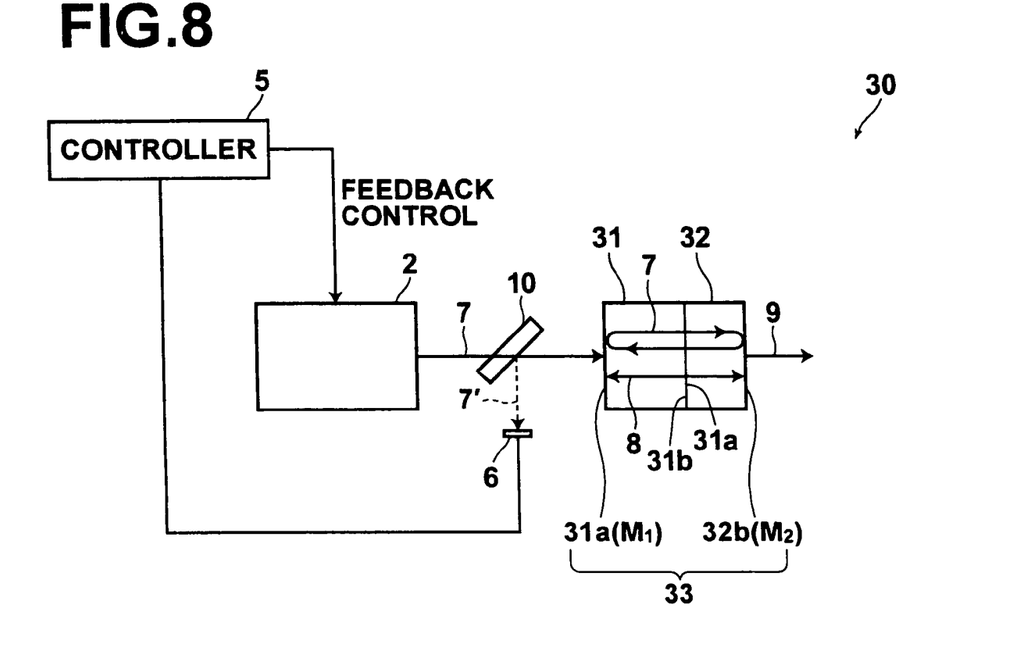
FIG. 8 is a diagram that illustrates the schematic structure of a solid state laser oscillator according to a third embodiment of the present invention.

Next, a solid state laser oscillator 30 according to a third embodiment of the present invention will be described. FIG. 8 is a diagram that illustrates the schematic construction of the solid state laser oscillator 30. The solid state laser oscillator 30 comprises: a solid state laser crystal 31 (laser crystal), in which rare earth ions or transition metal ions are doped; a nonlinear medium 32 (nonlinear crystal), which is a wavelength converting element for converting the wavelength of light emitted by the laser crystal 31; and pumping means, for outputting a pumping light beam 7 that excites the laser crystal 31.

The pumping means is the same as the pumping laser 2 that outputs a laser beam having at least two longitudinal modes of the solid state laser oscillator according to the first embodiment.

An end facet 31b of the laser crystal 31 and an end facet 32a of the nonlinear crystal 32 are bonded. A rear side end facet 31a (mirror M1), which is the other end facet of the laser crystal 31, and an output side end facet 32b (mirror M2), which is the other end facet of the nonlinear crystal 32, constitute a resonator 33, in which both an emitted light beam 8 and the pumping light beam 7 resonate.

The solid state laser oscillator 30 is the same as that of the first embodiment, in that the pumping light beam 7 is reciprocally reflected in a resonant manner within the external resonator 33 constituted by the mirrors M1 and M2, to bring about laser oscillation. However, the solid state laser oscillator 30 differs from that of the first embodiment in that the emitted laser beam 8 is converted to a second harmonic wave by the nonlinear crystal 32, and that an output light beam 9 has a second harmonic wavelength.

The solid state laser oscillator 30 employs Nd:YAG (Nd doping concentration: 0.1 at %) as the laser crystal 31, to perform quasi three level oscillation at 946 nm. The laser crystal 31 has a crystal length d of 0.5 mm, and an absorption coefficient α of 0.5 cm$^{-1}$. The wavelength of the pumping light beam 7 is 810 nm. KNbO$_3$ is employed as the nonlinear crystal 32. Type I phase matching is employed to experiment with a phase matching angle of 60.5 degrees and a KNbO$_3$ crystal length of 2 mm. At this time, a 70 mW blue (473 nm) output second harmonic wave 9 was obtained with a pumping power of 300 mW. A coating having a reflectance of 80% with respect to the pumping light beam 7, and highly reflective (HR) with respect to the emitted light beam 8 was administered to form the mirror M1. A coating highly reflective with respect to the pumping light beam 7, and anti reflective (AR) with respect to the second harmonic wave 9 was administered to form the mirror M2.

Note that a 240 nm deep ultraviolet light beam 9 was obtained by using a GaN semiconductor laser (440 nm) as the pumping light source and a Pr:YLF crystal as the solid state laser crystal 31, in a solid state laser oscillator having a similar construction, by converting a 480 nm emitted light beam 8 to the second harmonic. In this case, the laser output is only 0.1 mW. However, an ultraviolet laser was realized with an extremely compact construction.

In the solid state laser oscillator 30 of the third embodiment, the rear side end facet 31a of the laser crystal 31 and the output side end facet 32b of the nonlinear crystal 32 constitute the resonator 33, in which both the emitted light beam 8 and the pumping light beam 7 resonate. However, the pumping light beam 7 needs only to be absorbed by the laser crystal, and therefore the pumping light beam needs only to resonate within the laser crystal. An example of such a solid state laser oscillator will be described as a fourth embodiment of the present invention.

Figure 9:
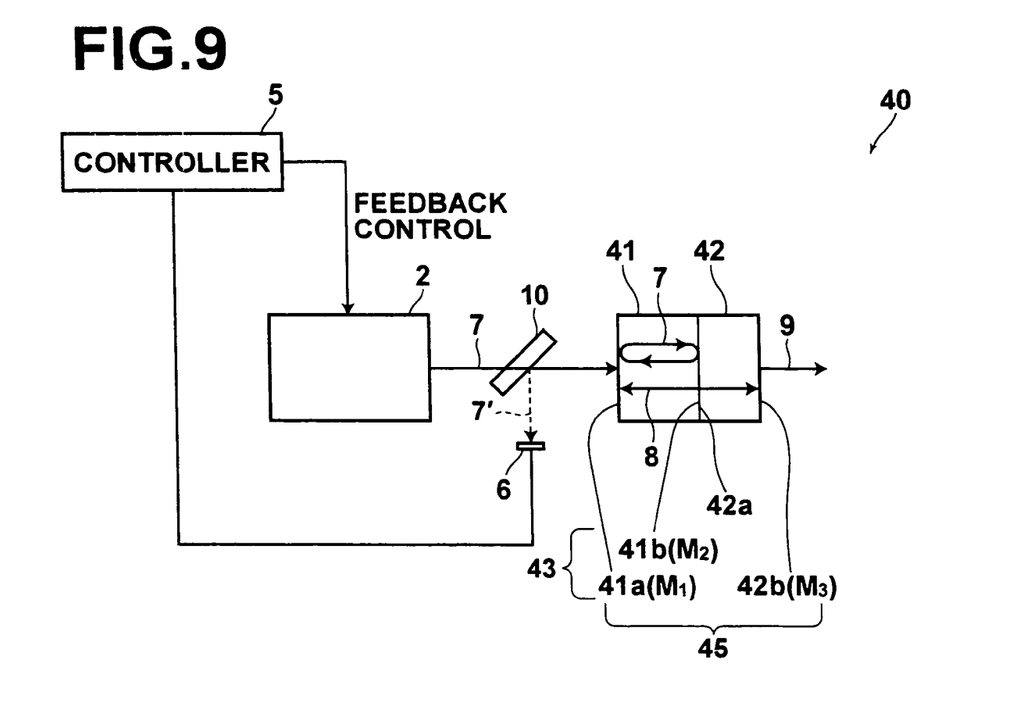
FIG. 9 is a diagram that illustrates the schematic structure of a solid state laser oscillator according to a fourth embodiment of the present invention.

FIG. 9 is a diagram that illustrates the schematic construction of a solid state laser oscillator 40 according to the fourth embodiment. The solid state laser oscillator 40 is the same as that of the third embodiment, in that a laser crystal 41 and a nonlinear crystal 42 that generates a second harmonic wave are bonded at one end facet 41b and 42a thereof. However, the solid state laser oscillator 40 differs from that of the third embodiment in that a resonator for an emitted light beam 8 and a resonator for a pumping light beam 7 are structured individually. Specifically, a resonator 43 in which the pumping light beam 7 resonates is constituted by a rear side end facet 41a (mirror M1) and an output side end facet 41b (mirror M2) of the laser crystal 41, and a resonator 45 in which the emitted light beam 8 resonates is constituted by the rear end facet 41a (mirror M1) of the laser crystal 41 and an output side end facet 42b (mirror M3) of the nonlinear crystal 42. A coating having a reflectance of 80% with respect to the pumping light beam 7, and highly reflective (HR) with respect to the emitted light beam 8 is administered to form the mirror M1. Coatings highly reflective with respect to the emitted light beam 8 and anti reflective (AR) with respect to the second harmonic wave 9 were administered to form the mirrors M2 and M3.

The external resonator 43 (mirrors M1 and M2) for the pumping light beam 7 and the external resonator 45 for the emitted light beam 8 (mirrors M2 and M3) are separated in this manner. Therefore, the pumping laser 2 needs only to emit a laser beam having a coherence length which is determined by the length of the laser crystal 41. Accordingly, the solid state laser oscillator of the fourth embodiment illustrated in FIG. 9 can emit a pumping light beam having a shorter coherence length than the solid state laser oscillator of the third embodiment illustrated in FIG. 8.

Figure 10:
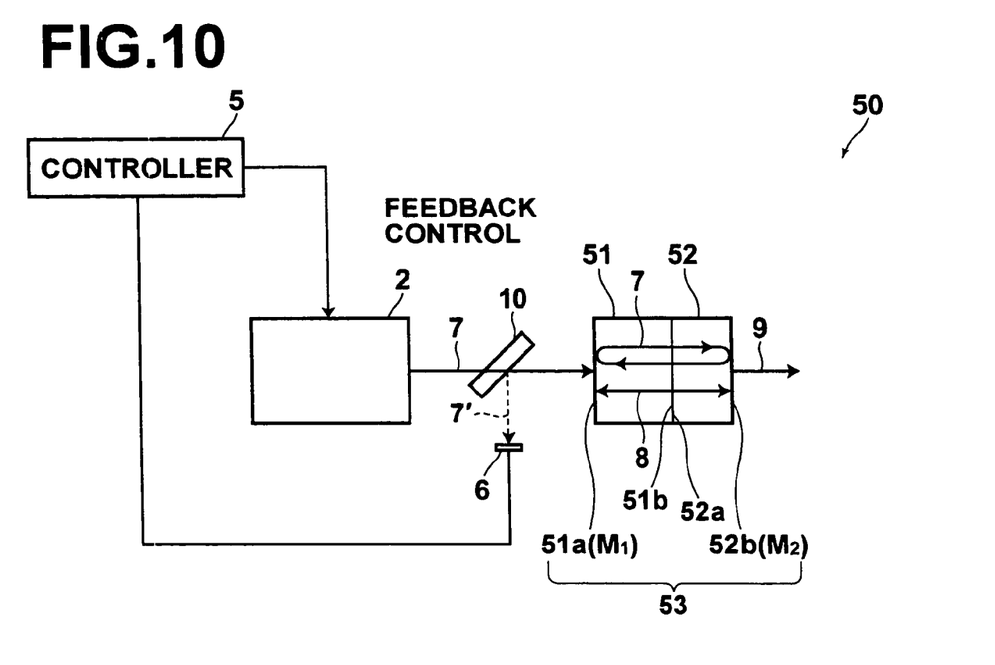
FIG. 10 is a diagram that illustrates the schematic structure of a solid state laser oscillator according to a fifth embodiment of the present invention.

The schematic construction of a solid state laser oscillator 50 according to a fifth embodiment is illustrated in FIG. 10.

The solid state laser oscillator 50 comprises: a solid state laser medium 51 (laser crystal); and a nonlinear crystal 52 for generating a sum frequency or a difference frequency of a pumping light beam 7 and a light beam 8 emitted by the solid state laser crystal. An end facet 51b of the laser crystal 51 and an end facet 52a of the nonlinear crystal 52 are bonded. A rear side end facet 51a (mirror M1 of the laser crystal 51 and an output side end facet 52b (mirror M2) of the nonlinear crystal 52 constitute a resonator 53, in which both the pumping light beam 7 and the emitted light beam 8 resonate.

In the case that Nd:YAG is employed as the solid state laser crystal 51, for example, at 1064 nm oscillation, sum frequency generation between the 809 nm pumping light beam 7 and the 1064 nm emitted light beam 8 will yield a 459.5 nm light beam in the blue range. Meanwhile, difference frequency generation will yield a 3375 nm light beam in the mid infrared range. Light beams having a wavelength of 459.5 nm are suited for use in various optical chemical reactions, display, and medical applications, and many resonance lines for molecular vibration transitions exist in light beams having a wavelength of 3375 nm, which is usable for identifying chemical substances. At 946 nm oscillation of Nd:YAG, sum frequency generation between the 809 nm pumping light beam 7 and the 946 nm emitted light beam 8 will yield a 436 nm light beam, and difference frequency generation will yield a 5586 nm light beam in the mid infrared range. Practically usable wavelength ranges can be obtained with an extremely compact structure.

Figure 11:
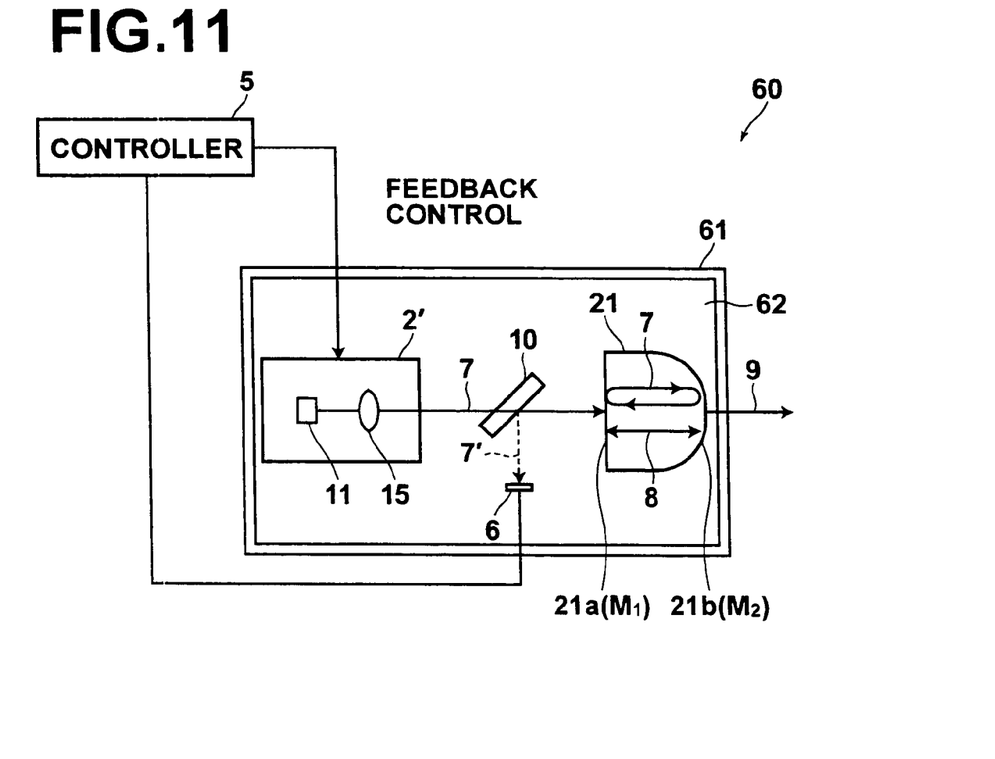
FIG. 11 is a diagram that illustrates the schematic structure of a solid state laser oscillator according to a sixth embodiment of the present invention.

Next, a solid state laser oscillator 60 according to a sixth embodiment of the present invention will be described with reference to FIG. 11. The solid state laser oscillator 60 is of substantially the same construction as the solid state laser oscillator of the second embodiment, except that the laser crystal 21 is included in a package 61 (for example, a can package or a butterfly package) of the semiconductor laser 11. This embodiment takes advantage of the fact that extremely thin laser crystals can be employed. By using thin (for example, 0.5 mm or less) laser crystals, requirements regarding the spectral width of the pumping light beam 7 are greatly alleviated, and effective absorptance can be increased without narrowing the bandwidth thereof much. Accordingly, here, a pumping laser 2' is constituted solely by the semiconductor laser 11 and a condensing lens 15. The pumping laser 2' and the laser crystal 21 are mounted on a heatsink 62 that functions as a support. The solid state oscillator can be provided with an extremely compact structure, housed within a single package 61.

Each of the above embodiments have been described mainly as those that employ Nd:YAG. However, it goes without saying that the solid state laser medium is not limited to this, and any solid state laser medium, in which rare earth ions or transition metal ions are doped, may be used. Note that the present invention can be widely applied to laser crystals that have low single pass absorptance and to laser media, such as quasi three level laser media, in which laser oscillation efficiency decreases if the absorptance is increased, due to reabsorption loss by lower level lasers.

Each of the above embodiments have been described mainly as those in which resonators cause both the pumping light beam and the emitted light beam to resonate. However, the present invention is not limited to this configuration, and separate resonators may be provided for the pumping light beam and the emitted light beam.

Figure 12:
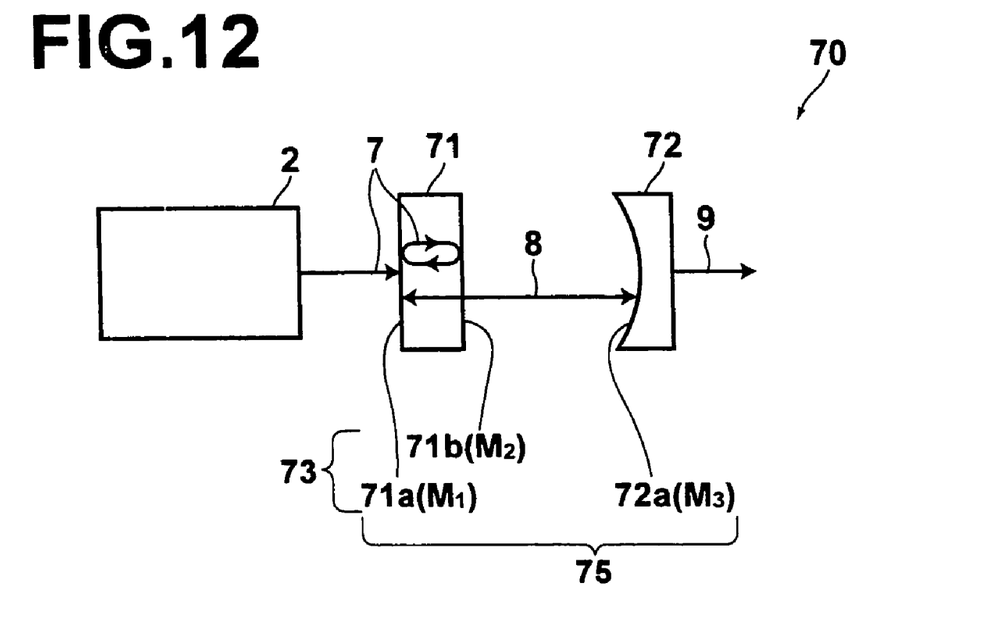
FIG. 12 is a diagram that illustrates the schematic structure of a solid state laser oscillator according to a seventh embodiment of the present invention.

FIG. 12 is a diagram that illustrates the schematic construction of a solid state laser oscillator 70 according to a seventh embodiment of the present invention. The solid state laser oscillator 70 comprises: the pumping laser; a solid state laser medium 71; and a concave output mirror 72. A resonator 75, in which the emitted light beam 8 resonates, is constituted by a rear side end facet 71a (mirror M1) of the solid state laser medium 71 and a mirror surface 72a (mirror M3) of the concave output mirror 72. A second resonator 73, in which the pumping light beam 7 resonates, is constituted by the rear side end facet 71a (mirror M1) and an output side end facet 71b (mirror M2) of the solid state laser medium 71.

Figure 13:
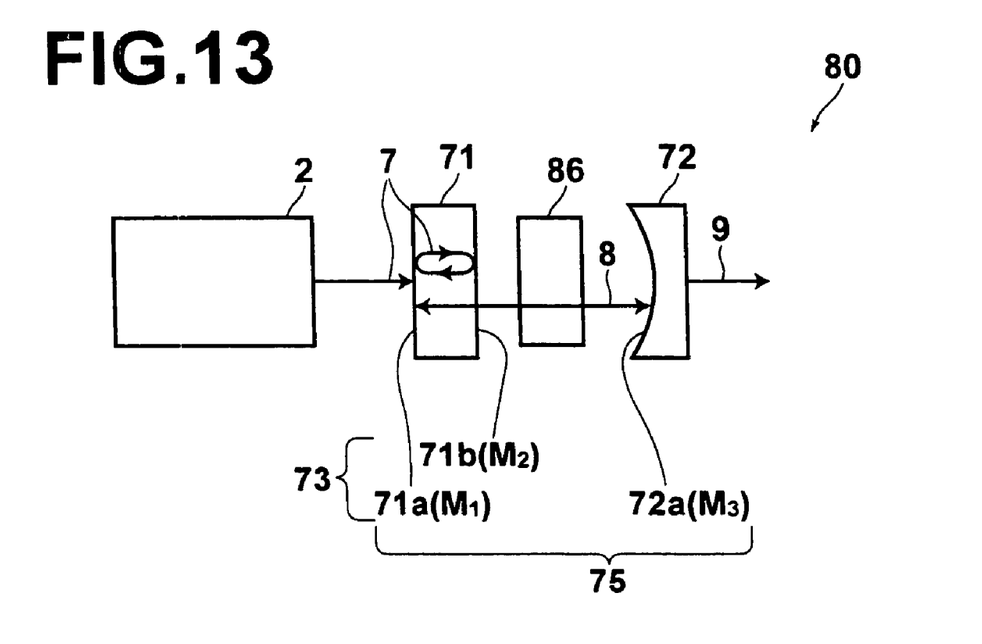
FIG. 13 is a diagram that illustrates the schematic structure of a solid state laser oscillator according to a eighth embodiment of the present invention.

FIG. 13 is a diagram that illustrates the schematic construction of a solid state laser oscillator 80 according to an eighth embodiment of the present invention. The solid state laser oscillator 80 is substantially the same as the solid state laser oscillator 70, except that it further comprises a nonlinear medium 86, which is a second harmonic converting element for converting the light beam 8 emitted form the solid state laser medium 71 into a second harmonic wave. That is, the output light beam 9 of the solid state laser oscillator 80 is a second harmonic wave.

In the solid state laser oscillators of the seventh and eighth embodiments as well, the pumping light beam is caused to resonate within the resonator 73 constituted by the two end facets 71a and 71b of the laser medium 71. The absorptance of the solid state laser medium with respect to the pumping light beam 7 is increased by causing the pumping light beam to be reciprocally reflected within the solid state laser medium. In addition, the pumping laser 2 is that which emits a laser beam having at least two longitudinal modes as the pumping light beam 7. Therefore, a more compact and high output device can be provided, compared to a case in which a single longitudinal mode pumping laser is employed as the pumping means.

What is claimed is:

1. A solid state laser oscillator comprising:
   a solid state laser medium;
   a first resonator in which the solid state laser medium is provided, for causing light output from the solid state laser medium to oscillate as a laser beam; and
   pumping means, for outputting a pumping light beam that excites the solid state laser medium; wherein:
   rare earth ions or transition metal ions are doped in the solid state laser medium;
   two end facets of the solid state laser medium function as resonating mirrors to construct a second resonator in which the pumping light beam resonates;
   the pumping means outputs a laser beam, having at least two longitudinal modes and a coherence length greater than or equal to the resonator length of the second resonator, to be input to the solid state laser medium such that the laser beam resonates within the second resonator.

2. A solid state laser oscillator as defined in claim 1, wherein:
   the absorptance of the solid state laser medium with respect to the pumping light beam in a single pass is less than or equal to 40%.

3. A solid state laser oscillator as defined in claim 1, wherein:
   the absorptance of the solid state laser medium with respect to the pumping light beam in a single pass is less than or equal to 20%.

4. A solid state laser oscillator as defined in claim 1, wherein:
   the absorptance of the solid state laser medium with respect to the pumping light beam in a single pass is less than or equal to 10%.

5. A solid state laser oscillator as defined in claim 1, wherein:
   the pumping light intensity reflectance R1 of an input mirror, which is one of the resonating mirrors that constitute the second resonator, for leading the pumping light beam into the second resonator satisfies the conditions:

$$R_m e^{-2\gamma} e^{-L/L_c} \leq R_1 \leq 2x R_m e^{-2\gamma} e^{-L/L_c}$$

wherein: Rm is a product of the pumping light intensity reflectance of mirrors that constitute the second resonator other than the input mirror and the propagation efficiency within the resonator; $\gamma = \alpha d \cos\theta$ is an attenuation coefficient of the pumping light electrical field for one orbit within the solid state laser medium; d is a medium length of the solid state laser medium; $\alpha$ is the absorptance of the solid state laser medium with respect to the pumping light beam; $\theta$ is the incidence angle of the pumping light beam with respect to the solid state laser medium; L is the resonator length of the second resonator; and Lc is the coherence length of the pumping light beam.

6. A solid state laser oscillator as defined in claim 1, wherein:
   the solid state laser medium emits visible light.

7. A solid state laser oscillator as defined in claim 1, wherein:
   the pumping means comprises a GaN type semiconductor laser.

8. A solid state laser oscillator as defined in claim 1, wherein:
   two end facets of the solid state laser medium also constitute the first resonator.

9. A solid state laser oscillator as defined in claim 1, further comprising:
   a nonlinear medium, which is a wavelength converting element for converting the wavelength of light emitted by the solid state laser medium, provided within the first resonator.

10. A solid state laser oscillator as defined in claim 1, wherein:
    the pumping means and the solid state laser medium are mounted within the same package.

11. A solid state laser oscillator as defined in claim 10, wherein:
    the pumping means and the solid state laser medium are held by a single support, or held by a support which is integrated by bonding.

12. A solid state laser oscillator as defined in claim 1, further comprising:
    temperature adjusting means, for adjusting the temperatures of the pumping means and the solid state laser medium.

13. The solid state laser oscillator as defined in claim 12, wherein the end facets comprise an input facet and an output facet, the oscillator further comprising:
    a mirror disposed between the input facet and the pumping means, which mirror reflects at least a portion of the emitted light and transmits the reflected portion to the temperature adjusting means.

14. The solid state laser oscillator as defined in claim 13, wherein the temperature adjusting means comprises:
    a temperature controller, in optical communication with the mirror, which monitors the reflected portion; and
    a cooling element which adjusts the temperatures of the pumping means and the solid state laser medium based on the monitored reflected portion.

* * * * *